(12) United States Patent
Held

(10) Patent No.: US 7,804,304 B2
(45) Date of Patent: Sep. 28, 2010

(54) METHOD FOR MEASURING THE NOISE FIGURE OF A DEVICE UNDER TEST WITH A NETWORK ANALYSER

(75) Inventor: Werner Held, Pocking (DE)

(73) Assignee: Rohde & Schwarz GmbH & Co. KG, München (DE)

( * ) Notice: Subject to any disclaimer, the term of this patent is extended or adjusted under 35 U.S.C. 154(b) by 272 days.

(21) Appl. No.: 12/095,865

(22) PCT Filed: Nov. 16, 2006

(86) PCT No.: PCT/EP2006/011019

§ 371 (c)(1),
(2), (4) Date: Jul. 15, 2008

(87) PCT Pub. No.: WO2007/068323

PCT Pub. Date: Jun. 21, 2007

(65) Prior Publication Data

US 2008/0297172 A1 Dec. 4, 2008

(30) Foreign Application Priority Data

Dec. 14, 2005 (DE) ........................ 10 2005 059 791

(51) Int. Cl.
G01R 29/24 (2006.01)
(52) U.S. Cl. ........................ 324/614; 324/613
(58) Field of Classification Search .................. 324/613, 324/614
See application file for complete search history.

(56) References Cited

U.S. PATENT DOCUMENTS

| 5,191,294 | A | 3/1993 | Grace et al. | |
|---|---|---|---|---|
| 6,434,501 | B1 * | 8/2002 | Cherrette et al. | ............ 702/120 |
| 6,714,898 | B1 | 3/2004 | Kapetanic et al. | |
| 6,965,242 | B2 | 11/2005 | Boss et al. | |

FOREIGN PATENT DOCUMENTS

| DE | 4122189 | 1/1993 |
|---|---|---|
| DE | 10302362 | 1/2004 |
| EP | 0874245 | 10/1998 |
| EP | 1139107 | 10/2001 |
| WO | WO-0025142 | 5/2000 |

OTHER PUBLICATIONS

Sinclair M.W. "Noise Measurements," Microwave Measurements (1989).
International Search Report for PCT/EP2006/011019 dated Apr. 26, 2007.

* cited by examiner

*Primary Examiner*—Vincent Q Nguyen
(74) *Attorney, Agent, or Firm*—Marshall, Gerstein & Borun LLP

(57) ABSTRACT

A method for measuring the noise factor ($F_{DUT}$) of a device under test, which requires exclusively a network analyzer. The noise factor ($F_{DUT}$) is calculated from the internal noise ($N_{NWA}$) of the network analyzer determined in a calibration process, the power amplification ($G_{DUT}$) of the device under test determined by measuring the S-parameters of the device under test, and the measured value ($P_{NOISE}$) of the noise output ($N_{NWA}$) applied at a first gate of the device under test without exciting the device under test with a noise signal.

9 Claims, 2 Drawing Sheets

METHOD FOR MEASURING THE NOISE FIGURE OF A DEVICE UNDER TEST WITH A NETWORK ANALYSER

BACKGROUND OF THE INVENTION

1. Field of the Invention

The invention relates to a method for measuring the noise figure of a device under test with a network analyzer.

2. Related Technology

The most important electrical parameters of a device under test (DUT) include the S-parameters and the noise factor. The noise factor is generally measured with a noise source and a spectrum analyzer. A network analyzer is generally used to measure the S-parameters.

A method and a device for determining the noise figure of electronic devices under test is known, for example, from DE 103 02 362 A1.

As will be shown in detail below, the power amplification of the device under test, which is dependent upon the S-parameters, is also required for a measurement of the noise figure of a device under test. A network analyzer, for determining the S-parameters for the power amplification of the device under test and a spectrum analyzer, for measuring the output noise power of the device under test, which is additionally required in the determination of the noise figure, are therefore disadvantageously both required for the measurement of the noise figure of a device under test.

SUMMARY OF THE INVENTION

The invention therefore provides a method for measuring the noise figure of a device under test, which requires a reduced number of measuring instruments.

For this purpose, the invention uses only a network analyzer, which, according to the prior art, provides an input sensitivity corresponding to the input sensitivity of a spectrum analyzer and which is therefore suitable for a measurement of the noise power. A network analyzer of this kind can be used to measure the S-parameters of the device under test, required for the determination of the associated power amplification, and also to measure the output noise power at one of the two ports of the device under test, which are connected respectively to a port of the network analyzer in each case without exciting the device under test with a noise signal generated by a noise source and without substantially changing the measurement structure.

The input impedance of the measuring port of the network analyzer is generally matched with a 50-Ω resistor. In the case of an error matching of the input impedance of the measuring port of the network analyzer, the measured output noise power must be corrected with an error-matching factor.

An inaccuracy between the correct measured value of the output noise power applied at the port to be measured of the device under test and the actually-measured, incorrect measured value of the output noise power applied at the port to be measured of the device under test and the internal noise of the network analyzer must be determined within the framework of a calibration process by exciting the measuring port to be measured of the network analyzer with the noise from a noise source, which is coupled to the network analyzer and switched on and then switched off again.

BRIEF DESCRIPTION OF THE DRAWINGS

An embodiment of the method according to the invention for measuring the noise factor of the device under test with a network analyzer is explained in greater detail below with reference to the drawings. The drawings are as follows.

DETAILED DESCRIPTION

Figure 1:
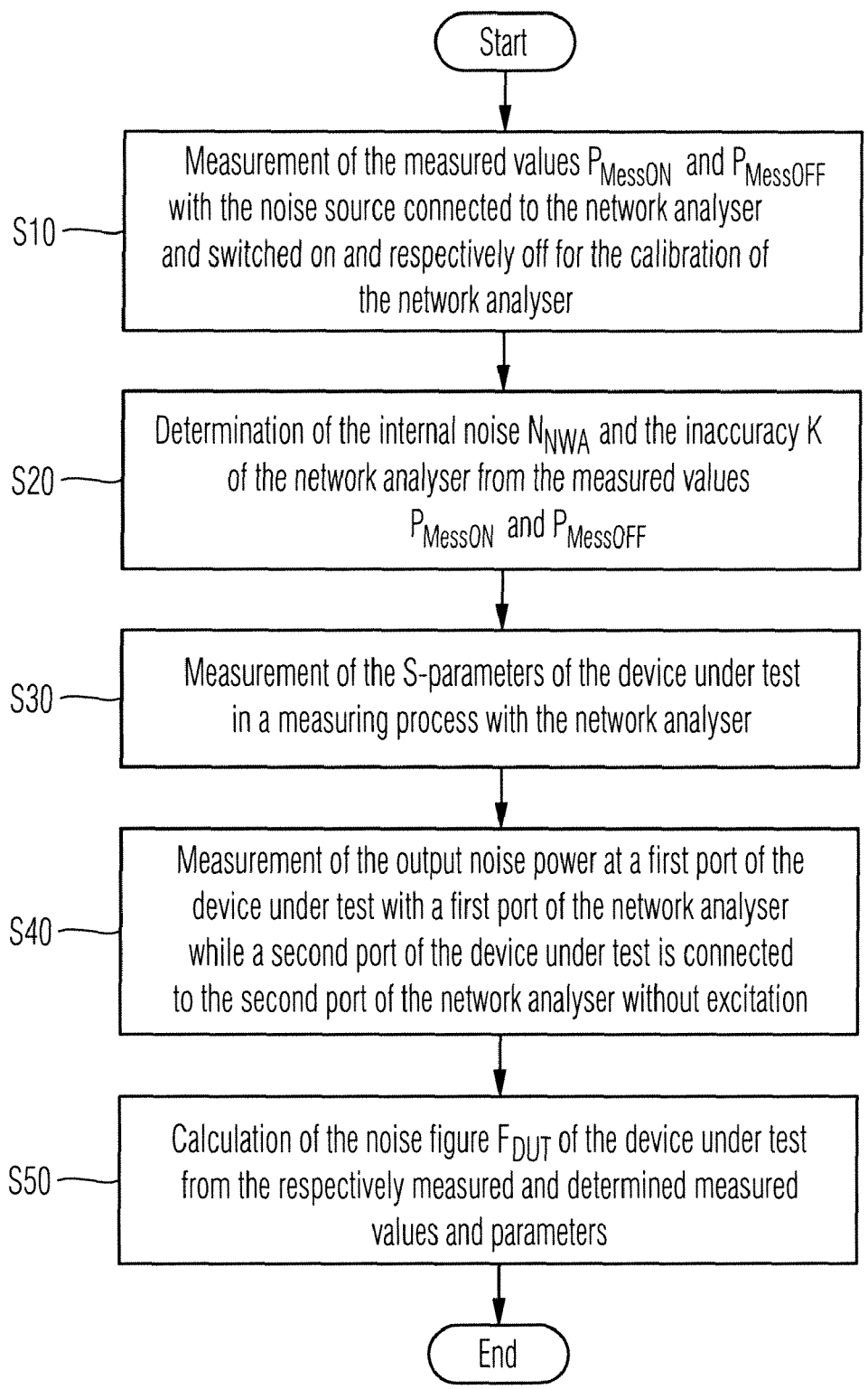
FIG. 1 shows a flow chart of the method according to the invention for measuring the noise figure of a device under test with a network analyzer.

Before the method according to the invention for measuring the noise figure of a device under test with a network analyzer (NWA) is explained in greater detail below with reference to FIGS. 1 to 3, the mathematical context necessary for an understanding of the method according to the invention will be described in the following paragraphs.

The noise figure $F_{DUT}$ of a device under test is defined as the ratio of the total output noise power $N_{OUT}$ at the output of the device under test relative to the output noise power $N_{OUT}$ at the output of the device under test, which results exclusively from the noise power applied at the input of the device under test. The total output noise power $N_{OUT}$ at the output of the device under test is obtained according to equation (1) from the "noise-power sum", which is derived from the noise power $N_{OUT}$ generated by the device under test itself and the thermal noise $N_0$ of a 50-Ω resistor system always present in the case of a matched measuring circuit, amplified with the power amplification $G_{DUT}$ of the device under test, at a room temperature of 290 K.

$$N_{OUT} = (N_{DUT} + N_0) \cdot G_{DUT} \tag{1}$$

In the case of a device under test, of which the input is not excited by a noise source, the output noise power at the output of the device under test $N_{OUT}$, which results exclusively from the noise power present at the input of the device under test, corresponds according to equation (2) to the thermal noise $N_0$ of a 50-Ω resistor system at a room temperature of 290 K amplified with the power amplification $G_{DUT}$ of the device under test.

$$N_{OUT}' = N_0 \cdot G_{DUT} \tag{2}$$

Accordingly, the noise figure $F_{DUT}$ according to equation (3) is obtained:

$$F_{DUT} = \frac{N_{OUT}}{N_{OUT}'} = \frac{N_{DUT} + N_0}{N_0} \tag{3}$$

The noise factor $NF_{DUT}$ of a device under test represents the log of the noise figure $F_{DUT}$ of the device under test as shown in equation (4)

$$NF_{DUT} = 10 \cdot \log(F_{DUT}) \tag{4}$$

The measured value $P_{NOISE}$ of the output noise power $N_{OUT}$ of the device under test to be measured by the network analyzer is superposed with the internal noise $N_{NWA}$ of the network analyzer according to equation (5).

$$P_{NOISE} = N_{NWA} + N_{OUT} \tag{5}$$

If equations (1), (3) and (5) are combined, the formula contained in equation (6) for determining the noise figure $F_{DUT}$ is obtained.

$$F_{DUT} = \frac{P_{NOISE} - N_{NWA}}{G_{DUT} \cdot N_0} \tag{6}$$

The power amplification $G_{DUT}$ of the device under test is obtained with a 50-Ω system from the forward-S-parameter $S_{21}$ of the device under test according to equation (7):

$$G_{DUT} = |S_{21}|^2 \quad (7)$$

If the input impedance of the network analyzer does not provide the value 50Ω as a result of an error matching, the power amplification $G_{DUT}$ must be multiplied by an error-matching factor M according to equation (8), wherein, in this context, $\Gamma_{NWA}$ is the input-reflection coefficient of the network analyzer and $S_{22}$ is the output-reflection coefficient of the device under test.

$$M = \frac{1 - |\Gamma_{NWA}|^2}{|1 - S_{22} \cdot \Gamma_{NWA}|^2} \quad (8)$$

The thermal noise $N_0$ of a 50-Ω resistor system is obtained from the room temperature T of 290 K and the Boltzmann constant k according to equation $$4 \cdot 10^{-21} \frac{W}{HZ} = -174 \frac{dB_m}{Hz}. \quad (9)$$

as $$N_0 = k \cdot T = 4 \cdot 10^{-21} \frac{W}{HZ} = -174 \frac{dB_m}{Hz} \quad (9)$$

The internal noise $N_{NWA}$ of the network analyzer, which is additively superposed on the output noise power $N_{OUT}$ of the device under test, and an inaccuracy k of the network analyzer, which is multiplicatively superposed on the correct measured value $P_{NOISE}$ according to equation (10) and leads to an incorrect measured value $P_{Mess}$, are determined in a calibration process of the network analyzer.

$$P_{Mess} = k \cdot P_{NOISE} \quad (10)$$

For this purpose, the port to be measured of the network analyzer is connected to a noise source, which is switched off. The incorrectly-determined measured value $P_{MessOFF}$ at the port of the network analyzer corresponding to the correct measured value $P_{NOISEOFF}$ is obtained from the internal noise $N_{NWA}$ of the network analyzer with the noise source switched off and the thermal noise $N_0$ of a 50-Ω resistor system at a room temperature of 290 K in the case of a matched measuring circuit according to equation (11).

$$P_{MessOFF} = k \cdot P_{NOISEOFF} = k \cdot (N_{NWA} + N_0) \quad (11)$$

According to equation (12), the incorrectly-determined measured value $P_{MessON}$ corresponding to the correct measured value $P_{NOISEON}$ with the noise source switched on is obtained in a corresponding manner from the internal noise $N_{NWA}$ of the network analyzer, the thermal noise $N_0$ of a 50-Ω resistor system at a room temperature of 290 K, in a frequency range of 1 Hz in the case of a matched measuring circuit, and the excess noise $N_{NS}$ of the noise source.

$$P_{MessON} = k \cdot P_{NOISEON} = k \cdot (N_{NWA} + N_0 + N_{NS}) \quad (12)$$

The excess noise $N_{NS}$ of the noise source can be determined according to equation (13) from the ENR factor (excess-noise ratio) specified by the manufacturer of the noise source, which indicates the ratio of the excess noise of the noise source relative to the thermal noise $N_0$ of 50-Ω resistor system at a room temperature of 290 K.

$$N_{NS} = 10^{\frac{ENR}{10}} \cdot N_0 \quad (13)$$

From equations (11) to (13), the inaccuracy k is obtained according to equation (14), and the internal noise $N_{NWA}$ of the network analyzer is obtained according to equation (15) in each case by mathematical transformation.

$$k = \frac{P_{MesON} - P_{MessOFF}}{10^{\frac{ENR}{10}} \cdot N_0} \quad (14)$$

$$N_{NWA} = \frac{P_{MesOFF}}{k} - N_0 \quad (15)$$

Starting from equation (6) with the inaccuracy k calculated according to equation (14) taking into consideration equation (10), the noise figure $F_{DUT}$ for a device under test to be measured is obtained according to equation (16) from the incorrectly-determined measured value $P_{Mess}$ of the output noise power $N_{OUT}$ of the device under test:

$$F_{DUT} = \frac{\frac{P_{Mess}}{k} - N_{NWA}}{G_{DUT} \cdot N_0} \quad (16)$$

The method according to the invention for measuring the noise figure of a device under test with a network analyzer begins with the calibration of the network analyzer. For this purpose, in a calibration arrangement as shown in FIG. 2, the noise power of a noise source to be measured is connected to the first measuring port 3 of the network analyzer (NWA) 4. During the implementation of the method according to the invention for measuring the noise figure, the arrangement is operated at the constant room temperature T of 290 K, and the noise power spectrum to be registered is measured with a certain measurement bandwidth of the network analyzer 4 in order to obtain a thermal noise $N_0$ of the matched measurement circuit, which corresponds to a 50-Ω resistor system, with standardized scaling $$\text{value} - 174 \frac{dB_m}{Hz}.$$

Figure 2:
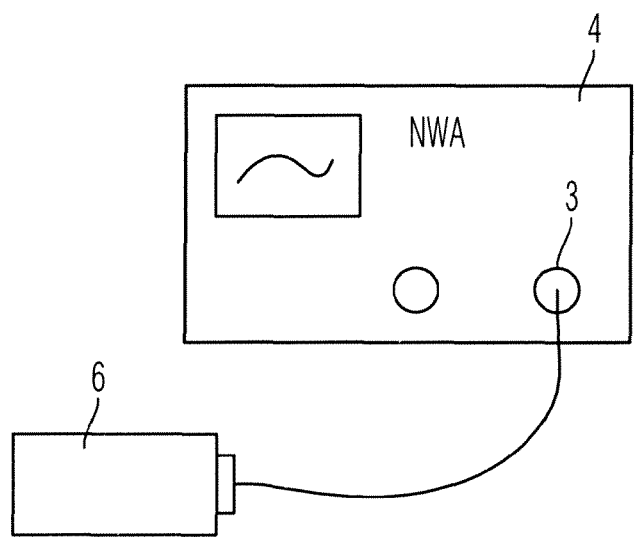
FIG. 2 shows a block-circuit diagram of an arrangement for the implementation of the calibration process of the network analyzer.

In the first procedural stage S10 of the method according to the invention for measuring the noise figure of a device under test with a network analyzer according to FIG. 1, with the noise source 6 switched off, the measured value $P_{MessOFF}$ at the first measuring port 3 of the network analyzer 4 is measured according to equation (11). In a similar manner, with the noise source 6 switched on, the measured value $P_{MessON}$ at the first measuring port 3 of the network analyzer 4 is measured according to equation (12).

In the next procedural stage S20, with the two measured values $P_{MessOFF}$ and $P_{MessON}$ buffered, the inaccuracy k and the internal noise $N_{NWA}$ of the network analyzer 4 are calculated according to equations (14) and (15) and buffered.

Figure 3:
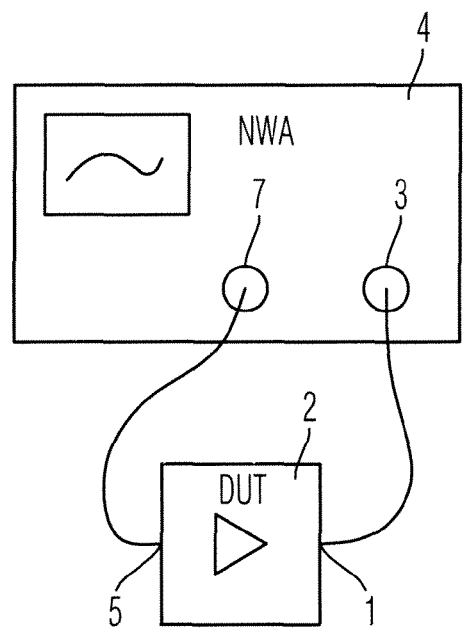
FIG. 3 shows a block-circuit diagram of an arrangement for the implementation of the measuring procedure of the noise-figure measurement with a network analyzer.

Following this, the calibration arrangement is converted into a measuring arrangement according to FIG. 3, in which the second port 5 of the device under test 2 is connected to the second port 7 of the network analyzer 4.

In this measuring arrangement according to FIG. 3, the individual S-parameters of the device under test 2 are determined according to known methods in procedural stage S30 using the network analyzer 4, and from the measured forward-S-parameter $S_{21}$, the power amplification $G_{DUT}$ of the device under test 2 is determined according to equation (7) and buffered. If the input impedance at the first port 3 of the network analyzer 4 is not matched to the value 50-Ω, the output reflection coefficient $S_{22}$ of the device under test 2 is multiplied by an error-matching factor M according to equation (8) in order to achieve a matching of the measuring arrangement in this manner.

In procedural stage S40, while the second port 5 of the device under test 2 connected to the second port 7 of the network analyzer 4 is not excited by the network analyzer 4 with a generator signal in the form of a noise signal, the measured value $P_{Mess}$ of the output noise power applied at the first port 1 of the device under test 2 is measured at the first port 3 of the network analyzer 4.

With the measured value $P_{Mess}$ of the output noise power applied at the first port 1 of the device under test 2 determined in the preceding procedural stage S40, the power amplification $G_{DUT}$ of the device under test 2 determined in procedural stage S30, the two parameters—inaccuracy k and internal noise $N_{NWA}$ of the network analyzer 4—determined and calculated in procedural stages S10 and S20—and the standardized parameter of the thermal noise $N_0$ of a 50-Ω resistor system, the noise figure $F_{DUT}$ is calculated in the final procedural stage S50 according to equation (16).

The invention claimed is:

1. Method for measuring the noise figure ($F_{DUT}$) of a device under test using only a noise source and a network analyzer, said device under test being characterized by power amplification ($G_{DUT}$) and forward-S-parameter ($S_{21}$) values and comprising first and second ports, said network analyzer comprising first and second measuring ports and being characterized by inaccuracy (k) and internal noise ($N_{NWA}$) values, said method comprising:

determining the inaccuracy (k) and the internal noise ($N_{NWA}$) of the network analyzer from a measured value ($P_{MessOFF}$), measured in a calibration process with the noise source switched off, at the first measuring port of the network analyzer connected to the noise source and a measured value ($P_{MessON}$), measured with the noise source switched on, at the first measuring port of the network analyzer connected to the noise source;

determining the power amplification ($G_{DUT}$) of the device under test from a measured forward-S-parameter ($S_{21}$) of the device under test, while the first port is connected to the first measuring port of the network analyzer and the second port is connected to the second measuring port of the network analyzer;

measuring, at the first port of the network analyzer, a measured value ($P_{Mess}$) of output noise power applied at the first port of the device under test, while the second port of the device under test is connected to the second port of the network analyzer and is not excited by the network analyzer with a generator signal in the form of a noise signal; and calculating the noise figure ($F_{DUT}$) from the measured value ($P_{Mess}$) of the output noise power, the power amplification ($G_{DUT}$) of the device under test, the inaccuracy (k), the internal noise ($N_{NWA}$) of the network analyzer, and thermal noise ($N_0$) of a 50-Ω resistor system.

2. Method for measuring the noise figure of a device under test according to claim 1,
   wherein the first measuring port of the network analyzer measuring the output noise power ($N_{NWA}$) applied at the first port of the device under test has an input impedance of 50-Ω at a room temperature of 290 K.

3. Method for measuring the noise figure of a device under test according to claim 1,
   comprising calculating the noise figure ($F_{DUT}$) of the device under test according to the following formula:

$$F_{DUT} = \frac{P_{NOISE} - N_{NWA}}{G_{DUT} \cdot N_0}$$

wherein
   $P_{NOISE}$ denotes the measured value of the output noise power $N_{NWA}$ to be measured by the network analyzer;

$N_{NWA}$ denotes the internal noise of the network analyzer;
   $G_{DUT}$ denotes the power amplification of the device under test; and
   $N_0$ denotes the thermal noise of a 50-Ω resistor at a room temperature of 290 K.

4. Method for measuring the noise figure of a device under test according to claim 1, comprising in the case of an error-matching of the input impedance of the first port measuring the output noise power ($N_{NWA}$) applied at the first port of the device under test, multiplying an output-reflection coefficient ($S_{22}$) measured at the first measuring port of the network analyzer by an error-matching factor M, which is calculated according to the following formula:

$$M = \frac{1 - |\Gamma_{NWA}|^2}{|1 - S_{22} \cdot \Gamma_{NWA}|^2}$$

wherein
   $\Gamma_{NWA}$ denotes an input-reflection coefficient of the network analyzer.

5. Method for measuring the noise figure of a device under test according to claim 1, comprising calculating the measured value $P_{NOISE}$ of the output noise power $N_{NWA}$ applied at the first port of the device under test to be measured at the first measuring port of the network analyzer by dividing a measured value $P_{Mess}$ of the output noise power $N_{NWA}$ applied at the first port of the device under test, incorrectly measured by the network analyzer, by an inaccuracy k of the network analyzer determined by calibration according to the following mathematical relationship:

$$P_{NOISE} = \frac{P_{Mess}}{k}.$$

6. Method for measuring the noise figure of a device under test according to claim 5,
   comprising calculating a measured value $P_{MessOFF}$ of the output noise power $N_{NWA}$ applied at the first port of the device under test, incorrectly measured at the first measuring port of the network analyzer in a calibration process with the noise source switched off and connected to the first measuring port of the network analyzer according to the following formula:

$$P_{MessOFF} = k \cdot (N_{NWA} + N_0),$$

wherein
   $N_0$ denotes the thermal noise of a 50-Ω resistor at a room temperature of 290 K; and
   k denotes an inaccuracy of the network analyzer.

7. Method for measuring the noise figure of a device under test according to claim 6,
   comprising calculating the measured value $P_{MessON}$ of the output noise power $N_{NWA}$ applied at the first port of the device under test, incorrectly measured at the first measuring port of the network analyzer in a calibration process with the noise source switched on and connected to the first measuring port of the network analyzer according to the following formula:

$$P_{MessON} = N_{NS} + N_{NWA} + N_0 = 10^{\frac{ENR}{10}} \cdot N_0 + N_{NWA} + N_0,$$

wherein
   $N_{NS}$ denotes the excess noise of the noise source; and

ENR denotes the ratio of the excess noise of the noise source relative to the thermal noise $N_0$ of a 50-Ω resistor at 290 K room temperature.

8. Method for measuring the noise figure of a device under test according to claim 7, comprising calculating the inaccuracy (k) of the network analyzer according to the following formula:

$$k = \frac{P_{MesON} - P_{MessOFF}}{10^{\frac{ENR}{10}} \cdot N_0}$$

9. Method for measuring the noise figure of a device under test according to claim 8, comprising calculating the internal noise $N_{NWA}$ of the network analyzer according to the following formula:

$$N_{NWA} = \frac{P_{MesOFF}}{k} - N_0$$

* * * * *